United States Patent [19]

Krishna et al.

[11] Patent Number: 4,648,909
[45] Date of Patent: Mar. 10, 1987

[54] FABRICATION PROCESS EMPLOYING SPECIAL MASKS FOR THE MANUFACTURE OF HIGH SPEED BIPOLAR ANALOG INTEGRATED CIRCUITS

[75] Inventors: Surinder Krishna, Fremont; Kulwant Egan, Santa Jose, both of Calif.

[73] Assignee: Fairchild Semiconductor Corporation, Cupertino, Calif.

[21] Appl. No.: 675,497

[22] Filed: Nov. 28, 1984

[51] Int. Cl.$^4$ .................. H01L 27/04; H01L 27/02
[52] U.S. Cl. .................. 148/1.5; 29/576 B; 29/577 C; 148/175; 148/187; 148/DIG. 10; 357/34; 357/91
[58] Field of Search .......... 148/1.5, 187, 175; 29/576 B, 577 C; 357/34, 91

[56] References Cited

U.S. PATENT DOCUMENTS

| | | | |
|---|---|---|---|
| 3,837,936 | 9/1974 | Kraft | 148/187 |
| 4,018,627 | 4/1977 | Polata | 148/1.5 |
| 4,021,270 | 5/1977 | Hunt et al. | 148/1.5 |
| 4,106,954 | 8/1978 | De Brebisson et al. | 148/1.5 |
| 4,111,726 | 9/1978 | Chen | 148/175 |
| 4,208,670 | 6/1980 | Hoffmann et al. | 29/571 |
| 4,272,304 | 6/1981 | Komatsu | 148/1.5 |
| 4,377,029 | 3/1983 | Ozawa | 29/576 B |
| 4,391,032 | 7/1983 | Schulte | 29/571 |
| 4,440,580 | 4/1984 | Gahle | 148/1.5 |
| 4,456,488 | 6/1984 | Gahle | 148/1.5 |
| 4,477,965 | 10/1984 | Blossfeld | 29/576 B |
| 4,512,816 | 4/1985 | Ramde et al. | 148/1.5 |

Primary Examiner—Upendra Roy
Attorney, Agent, or Firm—Carl L. Silverman; Stephen J. Phillips; Robert C. Colwell

[57] ABSTRACT

A fabrication process for integrated circuits having linear bipolar transistors and other circuit elements. The process defines collector contact 32, base 34, and isolation 36 regions in one masking operation. Subsequent masking layers of photoresist 40, 42, 46 are used to shield selected regions during implantation of exposed regions. Circuit density is improved through the use of aluminum doped isolation regions 36. The base region is doped in a single ion implantation step, which is followed by low temperature deposition of a covering oxide layer 48.

24 Claims, 13 Drawing Figures

FABRICATION PROCESS EMPLOYING SPECIAL MASKS FOR THE MANUFACTURE OF HIGH SPEED BIPOLAR ANALOG INTEGRATED CIRCUITS

BACKGROUND OF THE INVENTION

1. Field of the Invention

This invention relates generally to a process for fabricating semiconductor devices, and more particularly to a high yield process for fabricating integrated circuits having bipolar transistors and other circuit elements.

2. Description of the Prior Art

A fundamental circuit element of bipolar integrated circuits is an npn transistor. Structurally, a bipolar npn transistor has an N type collector and an N type emitter separated by a P type base. According to standard design practice, the collector is an island of N type material located on top of a P type substrate; the base is an island of P type material located within the collector; and the emitter is an island of N type material located within the base. Electrical contacts to the collector, emitter, and base regions are made from the top of the wafer. A low resistivity buried layer located under the base and collector contact minimizes the internal resistance of the collector. The collector region is an N type epitaxial layer formed on top of the P type substrate. The collector region is isolated from adjacent devices, usually by either a P type isolation region or by a region of silicon dioxide.

Integrated circuits used in linear circuit applications generally utilize npn transistors having high current gain and high breakdown voltages, while also having good high frequency response and high signal to noise ratio. Unfortunately, these desirable performance characteristics are often difficult to achieve in combination because an improvement in one characteristic may cause a deterioration in another.

In addition to performance considerations, another consideration in fabricating semiconductor devices is circuit density. Higher circuit density allows more devices to be fabricated on a single wafer, thereby lowering the cost of individual circuits. One factor adversity affecting circuit density is lateral diffusion of doped regions. High temperature processing after the creation of doped regions causes the doped regions to diffuse laterally. Spacing the circuit elements to allow for this lateral diffusion decreases circuit density. Another factor adversely affecting circuit density is mask alignment tolerances. Many circuit features are defined by several masks, each of which must be aligned with respect to previous masks. The alignment tolerance requires that features be larger (by an amount equal to the alignment tolerance) to accommodate the positional uncertainty of subsequent masks.

Another consideration particularly important in making bipolar devices is the fabrication of the base region of npn transistors. In fabricating an npn transistor, it is common to use two implantation steps to form the base region of the transistor. It is known that subsequent thermal oxidation of a wafer that has been heavily doped by ion implantation will cause dislocations and stacking faults to grow in the base region. Such defects adversely affect the performance of the transistor. To avoid this problem, it is common to implant the base region in two steps, first with a low dosage and then with a higher dosage, with a thermal oxidation step performed in between the implantation steps.

SUMMARY OF THE INVENTION

In accordance with the illustrated preferred embodiment, the present invention provides a high yield process for fabricating integrated circuits having bipolar transistors and other circuit elements. The process begins with a semiconductor structure that includes a silicon substrate of a first conductivity type, an overlying epitaxial layer of a second conductivity type, and a buried layer of the second conductivity type. A layer of silicon dioxide is formed over the epitaxial layer. In one embodiment the inventive process includes the steps of:

(1) forming openings in a first masking layer to define collector contact, base, and isolation regions;

(2) doping the collector contact region with second conductivity type impurity while the base and isolation regions are masked by a second masking layer;

(3) doping the isolation region with aluminum while the base and collector contact regions are masked by a third masking layer;

(4) doping the base region with first conductivity type impurity while the collector contact region is masked by a fourth masking layer;

(5) depositing a fifth masking layer on top of the base region;

(6) forming an opening in the fifth masking layer to define an emitter region; and (7) doping the emitter region with second conductivity type impurity.

One important aspect of the present invention is the manner in which the collector contact, base, isolation, and emitter regions are defined. One mask defines the collector contact, base, and isolation regions, while a second mask defines the emitter region and all ohmic contact regions. After the first mask defines the collector contact, base, and isolation regions, three separate layers of a masking material such as photoresist are used to shield selected regions during implantation of exposed regions. The alignment of the masking layers with respect to the regions is not critical, because the alignment tolerance may be as large as one half of the separation distance between the regions. Only the emitter mask must be precisely aligned with respect to the first mask. Because only two masks are used to define the the npn transistor structure, circuit density is improved.

Circuit density is also improved through the use of aluminum doped isolation regions. Generally, silicon dioxide is not employed to isolate linear npn transistors because of the thick epitaxial layers required for high voltage operation. Other fabrication processes have utilized boron doped isolation regions for linear circuits. Aluminum doped isolation, as used in the present invention, is superior to boron doped isolation because aluminum has a much higher diffusivity than boron, which allows the isolation diffusion to be accomplished in a shorter time. This reduction in diffusion time has the beneficial effect of reducing undesirable vertical diffusion of the buried layer toward the base and lateral diffusion of all the doped regions. Reduced buried layer diffusion allows the use of thinner epitaxial layers, while reduced lateral diffusion permits higher circuit density.

Another important aspect of the present invention is a process for fabricating a base region of a bipolar transistor. The base region is formed by implanting atoms through thermally-formed silicon dioxide and into the epitaxial layer to form a heavily doped base region. The wafer is then annealed in an inert atmosphere to repair the crystal lattice damage caused by the implantation. A layer of silicon dioxide is then deposited at low temperature over the thermal oxide to isolate the active devices from subsequently applied metal layers. Because the implanted base region is not exposed to a thermal oxidation step, no dislocations or stacking faults are created in the base region. Also, since the doping of the base region is performed by one rather than two ion implantation steps, the cost of fabrication is reduced.

DETAILED DESCRIPTION OF THE PREFERRED EMBODIMENT

Figure 8:
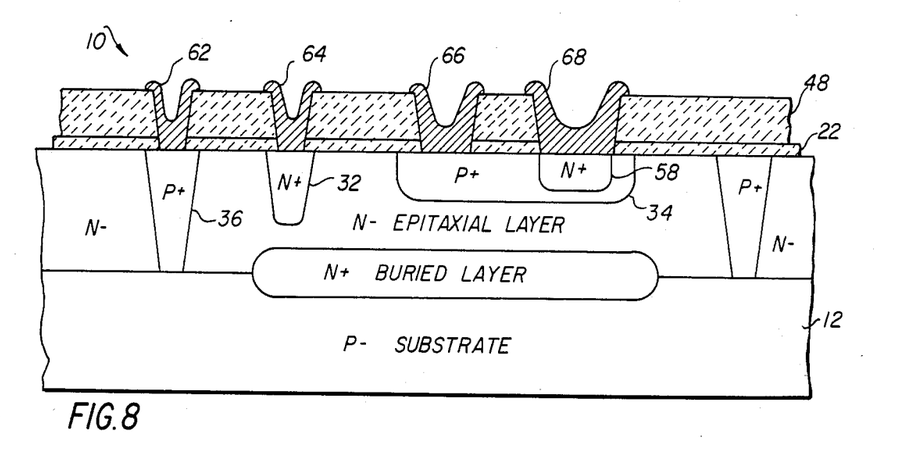
FIG. 8 is an cross-sectional view of the wafer after deposition and patterning of a metallization layer.
Figure 9:
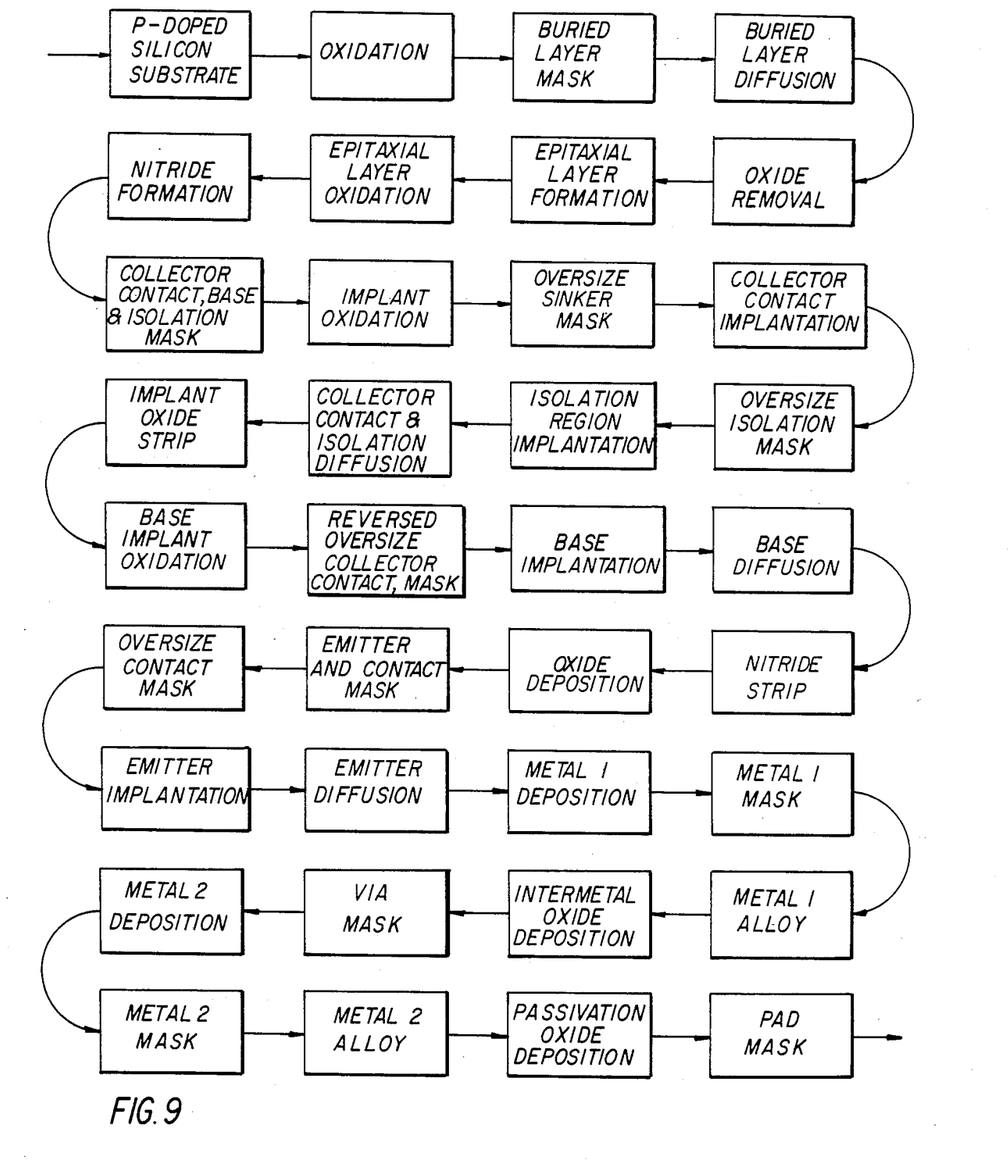
FIG. 9 is a flow chart of the integrated circuit fabrication process of the present invention.

The present invention relates to a high yield process for fabricating integrated circuits having bipolar transistors and other circuit elements. The preferred embodiment of the present invention is a process for fabricating npn bipolar transistors, and is described in detail below with reference to FIGS. 1 through 8. FIG. 9 is a flow chart that summarizes the preferred embodiment of the invention. Variations in the process for fabricating other devices are described below with reference to FIGS. 10 through 13. The sectional views illustrated in the Figures are not necessarily to scale.

Figure 1:
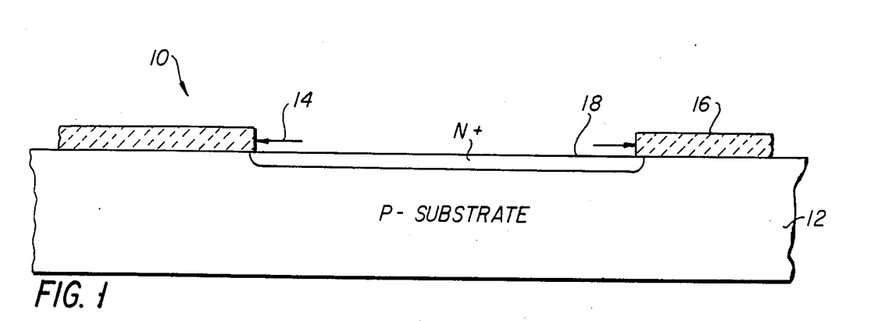
FIG. 1 is an cross-sectional view of a wafer after formation of a buried layer in a process for fabricating an npn transistor according to the present invention.

The preferred embodiment of the process begins with a P type silicon substrate 12 having a crystallographic orientation of $<111>$, as designated by Miller indices, and a resistivity in the range of 1.5 to 3.0 ohm-centimeters. The surface of the substrate is preferably positioned 4.5 degrees off the $<111>$ direction toward the nearest $<110>$ direction. Such substrates are commonly used for the fabrication of bipolar devices. "Substrate" as used herein refers to the P type region of silicon upon and partially within which the integrated circuits are fabricated, while "wafer" includes the substrate and the features and elements fabricated on top of the substrate.

The wafer is first thermally oxidized to form a layer 16 of silicon dioxide (oxide) on an upper surface of the substrate 12. An oxide layer thickness of approximately 8000 Angstroms is preferred.

Using a first mask, a window is opened in the oxide to enable formation of a buried layer. This is preferably done photolithographically by coating the wafer with a layer of photoresist, then exposing the photoresist using a buried layer mask, then developing the photoresist to expose a portion of the oxide layer, then etching the exposed oxide layer down to the substrate 12, then stripping the remaining photoresist from the wafer. As shown in FIG. 1, the wafer 10 has a portion of the substrate 12 exposed through a window 14 in the oxide layer 16.

An N type impurity, preferably antimony in the form of antimony trioxide, is next diffused into the P substrate 12 to form a heavily doped N+ buried layer 18. The buried layer will later serve as a heavily doped portion of a collector of an npn transistor. After forming the buried layer, oxide layer 16 is removed by etching in hydrofluoric acid.

Figure 2:
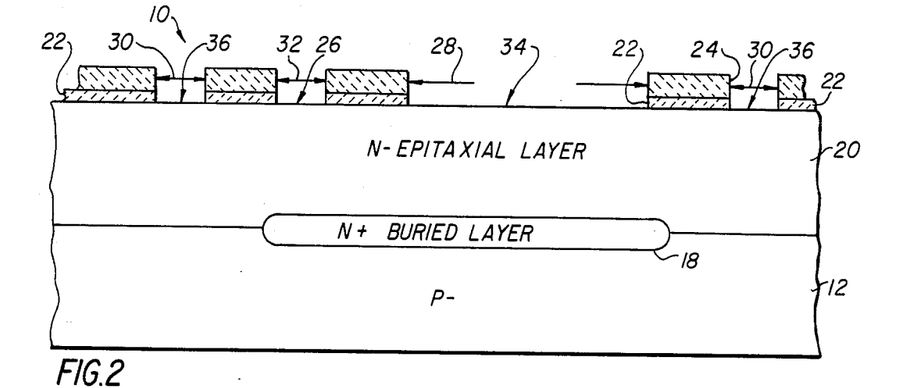
FIG. 2 is an cross-sectional view of the wafer after formation of openings in a first oxide layer to define collector contact, base, and emitter regions.

Next, as shown in FIG. 2, using dichlorosilane an epitaxial layer 20 is formed on top of buried layer 18 and substrate 12. Epitaxial layer 20 is lightly doped N conductivity and will have the same crystallographic orientation as the substrate. The thickness and resistivity of the epitaxial layer will affect the operational characteristics of the transistor, for example, gain and breakdown voltage. For an npn transistor having an operational voltage of 15 volts and breakdown voltage of 35 volts, it is desirable for the thickness of the epitaxial layer to be between 2.2 and 2.7 micrometers and the resistivity to be between 0.6 and 1.0 ohm-centimeters, with the optimum values in the center of each range. If the resistivity falls outside the range, either the breakdown voltage or the gain of the transistor will decrease to unacceptable values. It is preferable to form the epitaxial layer using a chemical vapor deposition technique with phosphine as a dopant. The concentration of the dopant controls the resistivity of the resulting epitaxial layer.

The top surface of the epitaxial layer 20 is oxidized in the next processing step to form a layer of silicon dioxide 22. Oxide layer 22 is thermally grown by placing the wafer in an oxidizing atmosphere at an elevated temperature. The preferred nominal thickness of oxide layer 22 is approximately 1000 Angstroms.

As a recommended, but optional, next step, a layer of silicon nitride 24 is deposited on top of oxide layer 22 using low pressure chemical vapor deposition. The preferred nominal thickness of the nitride layer 24 is approximately 2800 Angstroms. The nitride layer improves the resolution of later oxide etching steps.

Using a second mask, windows 26, 28, and 30 are defined in oxide and nitride layers 22 and 24. As shown in FIG. 2, the formation of windows 26, 28, and 30 exposes the upper surface of the epitaxial layer to define a collector contact region 32, a base region 34, and an isolation region 36. The isolation region encircles the collector contact and base regions and the buried layer. By defining all three regions with a single mask, the positions of the three regions are self-aligned with respect to each other. This eliminates the need to compensate for mask alignment tolerances, and thereby increases circuit density. In subsequent processing steps, certain regions will be masked by masking layers during ion implantation of the other regions of the transistor.

Figure 3:
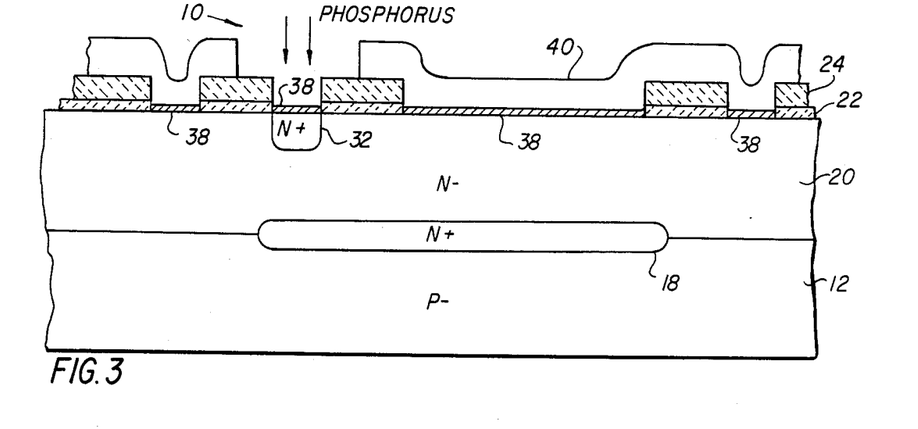
FIG. 3 is an cross-sectional view of the wafer after implantation of the collector contact region.

The next processing step, as shown in FIG. 3, is oxidizing the exposed areas of the epitaxial layer. To do so, a layer of silicon dioxide 38 is thermally grown to a preferred nominal thickness of about 650 Angstroms. Subsequent ion implantation of the collector contact and isolation regions is performed through oxide layer 38 to alleviate the problem of ion channeling.

Next, a masking layer 40 is deposited and defined using a third mask to form a first masking layer 40 over the base and isolation regions 34 and 36. This is accomplished by coating the top of the wafer 10 with a layer of photoresist material, then exposing the photoresist through a mask, and developing it. After developing, photoresist layer 40 covers the base and isolation regions 34 and 36, while the collector contact region 32 is exposed. The alignment of mask 40 with respect to the wafer is not critical, but must be sufficiently precise to insure that the collector contact region is exposed while the base, isolation and field regions are covered. The mask is oversized with respect to the base and isolation regions.

Next, the collector contact region 32 is implanted to form a heavily doped N+ region. In the preferred embodiment, phosphorus atoms are implanted through oxide layer 38 at an implantation energy of about 80 KeV and at a dosage of between $10^{14}$ and $10^{16}$ atoms per square centimeter. The wafer at this step in the process is illustrated in FIG. 3. The resulting heavily doped region 32 does not extend all the way down to the buried layer. The above recommended values for implantation energy and dosage can be increased if it is desired to minimize the resistance of the collector by joining the collector contact to the buried layer.

Figure 4:
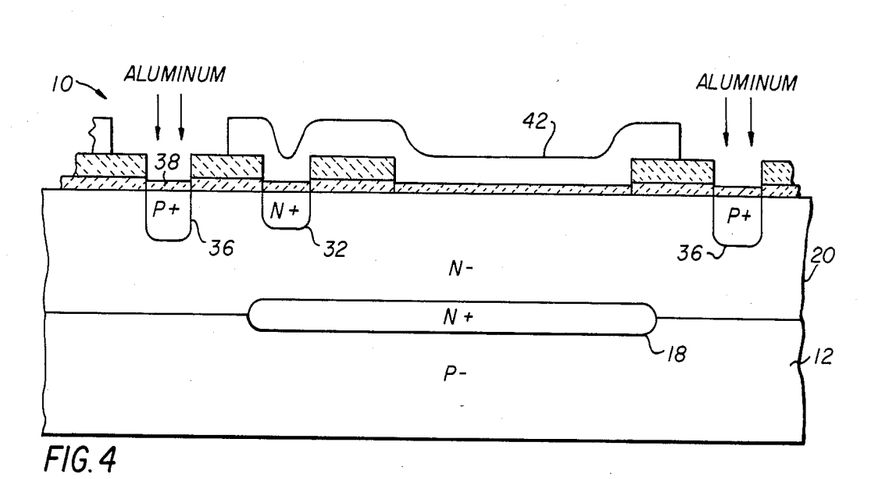
FIG. 4 is an cross-sectional view of the wafer after implantation of the isolation region.

The next steps of the process involve doping the isolation region 36 while masking the collector contact and base regions. First, the first masking layer 40 is removed. Then, a second masking layer 42 of photoresist material is formed over the collector contact and base regions, and partially removed using a fourth mask to expose the isolation region 36. As before, the alignment of this mask is not critical because the mask is oversized. Mask 42 is shown in FIG. 4. Next, as also shown in FIG. 4, the isolation region is ion implanted through oxide layer 38 with aluminum atoms to form a heavily doped P+ region. While the implantation energy and dosage are not critical, in the preferred embodiment the implantation energy is approximately 180 KeV and the dosage is approximately $5.0 \times 10^{14}$ atoms per square centimeter. FIG. 4 shows the wafer following this step in the process.

The next processing step anneals and diffuses the implanted collector contact 32 and isolation regions 36. The photoresist layer 42 is removed and the wafer heated to an elevated temperature in a diffusion furnace. In the preferred embodiment, this step consists of heating the wafer to a temperature of 950 degrees Celsius in a nitrogen atmosphere for 90 minutes. At the elevated temperature, annealing occurs to repair crystal lattice damage caused by ion implantation. Diffusion of the dopant atoms also occurs, causing the doped regions to expand. The collector contact, the isolation region, and the buried layer all expand in size. At this point, the P+ doped isolation region 36 has not yet joined with the P substrate to complete the electrical isolation of the transistor. A subsequent diffusion step will cause that to happen.

One important aspect of this invention is the use of aluminum doped isolation. Well known oxide isolation is not practical because of the relatively thick epitaxial layer used in linear transistors. Boron doped isolation, commonly used in the industry, results in excessive lateral diffusion because of the combination of the slow diffusivity of boron and the thickness of the epitaxial layer through which the dopant must diffuse. Two advantages of using aluminum as a dopant are: (1) because the total time in the diffusion furnace is reduced as compared to boron doped isolation, upward diffusion of the buried layer is reduced, enabling use of a much thinner epitaxial layer; and (2) because lateral diffusion is also reduced, circuit elements may be more closely spaced, thus increasing circuit density.

A preferred, but optional, next step involves the removal of oxide layer 38 and the regrowth of a somewhat thicker silicon dioxide layer 44. A thicker oxide layer better protects the surface of the epitaxial layer during a subsequent etching step. It is preferred that a new silicon dioxide layer 44 be thermally formed to a nominal thickness of about 1000 Angstroms. Alternatively, another option is to oxidize the silicon to form an additional 350 Angstroms to the existing 650 Angstroms of oxide layer 38. Of course, one may continue with only the thinner oxide in place, but at the added risk of damaging the emitter area during subsequent dry etching.

Figure 5:
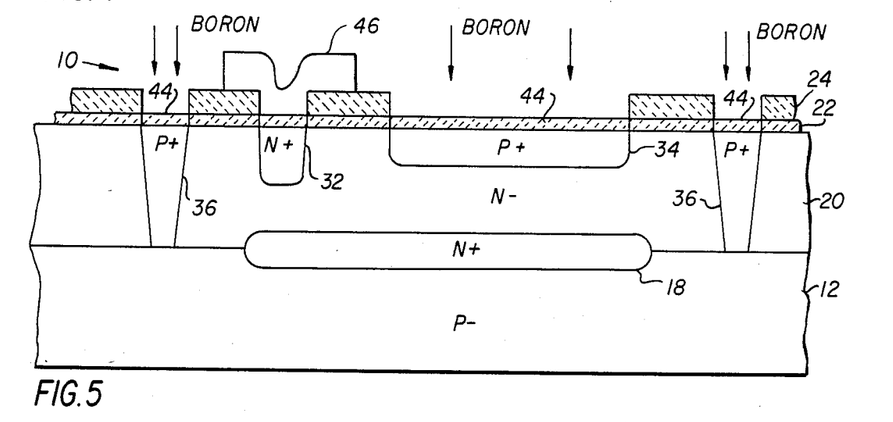
FIG. 5 is an cross-sectional view of the wafer after implantation of the base region.

As shown in FIG. 5, the next steps of the process involve doping the base region 34 while masking the collector contact region 32. A third masking layer 46 of photoresist is formed (using a fifth mask) covering the collector contact region, with the base region and the isolation region 36 exposed. Next, P type impurity is implanted through oxide layer 44 and into the base region to create a heavily doped P+ region, and into the isolation region to add to the doping of region 36. In the preferred embodiment, boron atoms are implanted at an implantation energy of about 50 KeV and at a dosage of between $8 \times 10^{13}$ and $1 \times 10^{15}$ atoms per square centimeter. The base region is fully doped by this implantation step; a subsequent implantation is not required. As an option, the isolation region may be covered by mask layer 46 to prevent implantation of boron atoms into the isolation region.

The implanted regions are then annealed and diffused. In the preferred embodiment, this step consists of placing the wafer in a furnace in a nitrogen atmosphere for 150 minutes at 1000 degrees Celsius. At this elevated temperature, all the doped regions increase in size. In addition, the crystal lattice in the base and isolation regions are annealed to repair implantation damage. This diffusion step causes the isolation region 36 to diffuse downward to join the P substrate 12, thereby isolating the portion of the epitaxial layer in which the transistor is formed. FIG. 5 shows the wafer following this step in the process.

The nitride layer 24 is next removed to expose oxide layer 22. This may be accomplished by etching using hot phosphoric acid. As an optional next step, a small amount of phosphorus is implanted through oxide layer 22 and into the upper surface of the epitaxial layer. This implantation acts to adjust the field threshold, and is necessary only if surface inversion is a problem.

Figure 6:
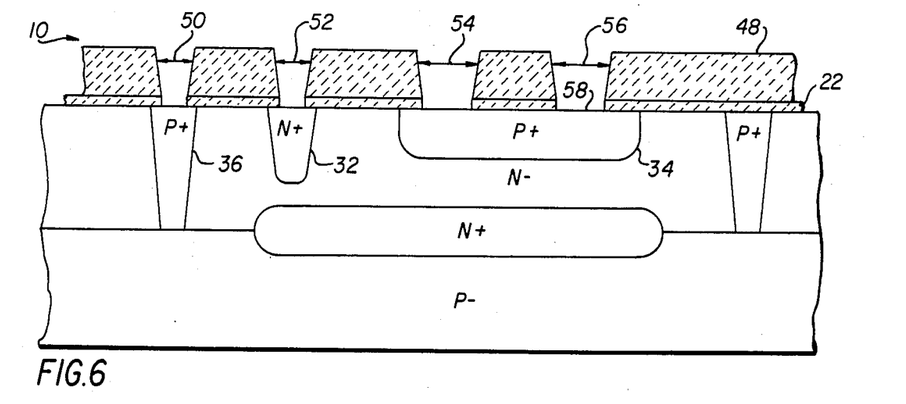
FIG. 6 is an cross-sectional view of the wafer after deposition of a second oxide layer and formation of openings in the second oxide layer to define an emitter region and ohmic contact regions.

As shown in FIG. 6, a layer of silicon dioxide 48 is deposited on top of oxide layer 22. Any oxide deposition process that is performed at a temperature of 750 degrees Celsius or less may be used. In the preferred embodiment, a low temperature oxide (LTO) process is used at a temperature of about 420 degrees Celsius to deposit about 4000 Angstroms of silicon dioxide. The low temperature of the process prevents the formation of defects in the base region which would occur at a higher temperature.

Using a sixth mask, windows 50, 52, 54, and 56 are defined in oxide layers 22 and 48. Windows 50, 52, and 54 expose areas of the isolation, collector contact, and base regions 36, 32, and 34 to be used as ohmic contacts. Window 56 exposes an area of the base region in which an emitter will be formed. Then the oxide layers are etched away, leaving the wafer as shown in FIG. 6.

Figure 7:
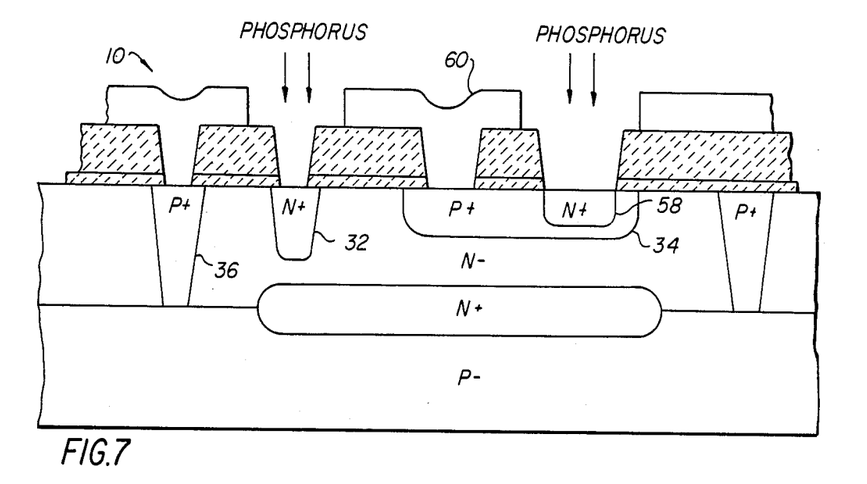
FIG. 7 is an cross-sectional view of the wafer after implantation of the emitter region.

Next, as shown in FIG. 7, the emitter region is doped while shielding the base and isolation regions. This is accomplished by defining photoresist 60, using a seventh mask, over the isolation and base regions, while exposing the collector contact and emitter regions. Next, N type impurity is implanted into the emitter region to create a heavily doped N+ region, and into the collector contact region to add to the doping of region 32. In the preferred embodiment, phosphorus atoms are implanted at an implantation energy of about 40 KeV and at a dosage of about $1 \times 10^{16}$ atoms per square centimeter. As an option, the collector contact region may be covered by mask layer 60 to prevent further implantation. FIG. 7 shows the wafer at this point. The mask layer 60 is then stripped, and the implanted regions annealed by heating the wafer to 900 degrees Celsius for 45 minutes in nitrogen.

An optional feature of the process forms a self-aligned polysilicon emitter/emitter contact. This is accomplished by opening a window in oxide layers 22 and 48, then depositing and doping a N+ layer of polycrystalline silicon. The polysilicon layer is masked and etched to leave only the emitter contact. Impurity from the polysilicon is then diffused into the base region to form the emitter.

The balance of the process relies upon conventional metallization steps. A first metal layer is deposited, then patterned by well known masking and etching processes, then alloyed to establish good contact with the underlying silicon. The resulting wafer is illustrated in FIG. 8, and includes metal contacts 62, 64, 66, and 68, which are respectively connected to substrate 12, collector contact region 32, base region 34, and emitter region 58.

To form a second layer of metal connections, another layer of silicon dioxide is deposited to insulate between the metal layers. Vias are then opened in the oxide layer and the second metal layer deposited. The metal is then patterned by another masking process, and then alloyed. A passivation oxide is deposited on top of the wafer and then vias are opened to external contact pads. The wafer is now ready for dicing. The entire process is summarized in the flow diagram of FIG. 9.

Figure 10:
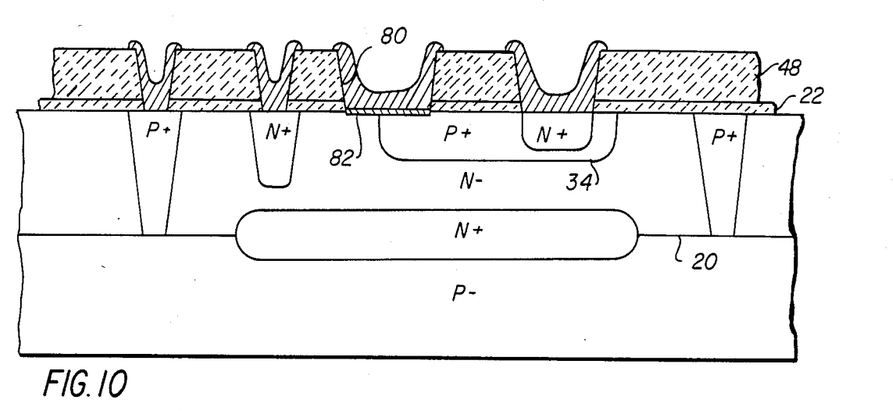
FIG. 10 is an cross-sectional view of a Schottky transistor as fabricated according to the process of the present invention.

The preferred process is readily adaptable to form Schottky transistors, as illustrated in FIG. 10. In the sixth mask, a window 80 is opened in oxide layers 48 and 22 to expose a portion 82 of both the base region 34 and the upper surface of the epitaxial layer 20. Then just prior to the metallization steps, the following steps are performed to construct a Schottky diode: platinum is sputtered onto the wafer; the wafer is heat treated to form platinum silicide is formed on surface 82; all unreacted platinum is removed, which leaves only the platinum silicide on surface 82; and titanium and tungsten are sputtered onto the wafer to form a bonding layer between the silicide and the subsequently applied metal layer.

Figure 11:
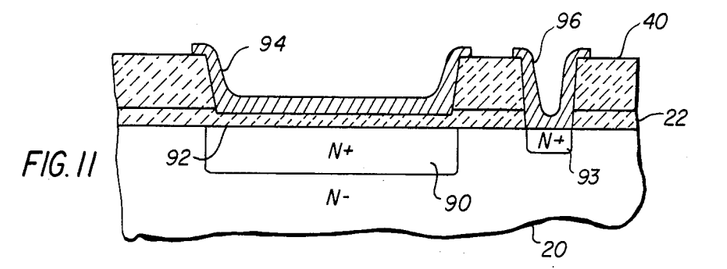
FIG. 11 is an cross-sectional view of a capacitor as fabricated according to the process of the present invention.

Capacitors are fabricated according to another variation in the process, as illustrated in FIG. 11. A heavily doped N+ region 90 is formed by implantation into the epitaxial layer 20 during the implantation of the collector contact region. After oxide layer 48 is deposited, oxide layers 48 and 22 are etched away, leaving only a thin layer of oxide 92. Metal contacts 94 and 96 are formed at the same time they are formed elsewhere on the wafer. The capacitor thus consists of contact 94 as one connection, contact 96 and N+ regions 90 and 93 as the other connection, and layer 92 as the dielectric.

Figure 12:
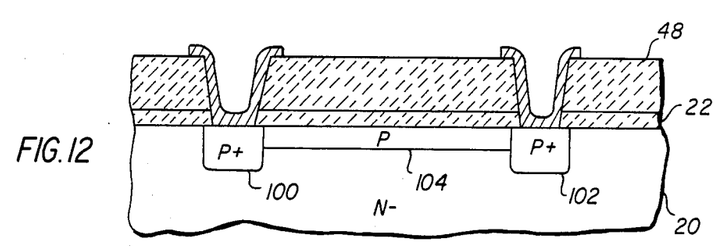
FIG. 12 is an cross-sectional view of an implant resistor as fabricated according to the process of the present invention.

Resistors may also be constructed by the process of this invention. As shown in FIG. 12, two heavily doped P+ regions 100 and 102 are formed by implantation into the epitaxial layer during the implantation of the base region. Region 104 is separately implanted with boron atoms to form the resistive element of the resistor. Regions 100 and 102 and their respective metal contacts form the connections to the resistor.

Figure 13:
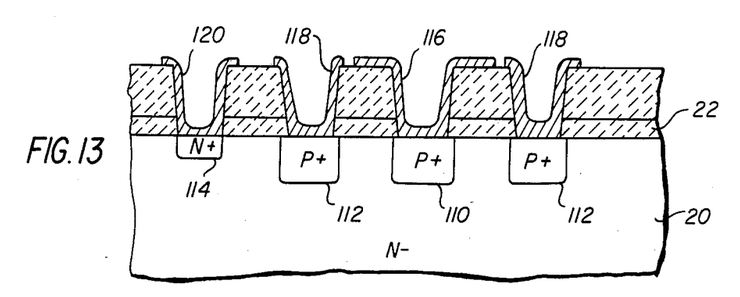
FIG. 13 is an cross-sectional view of a lateral pnp transistor as fabricated according to the process of the present invention.

The process may also be used to fabricate lateral pnp transistors, as shown in FIG. 13. Heavily doped P+ regions 110 and 112 are formed by implantation during the formation of the base region. A heavily doped N+ region 114 is formed by implantation during the formation of the emitter region. Later, metal contacts 116, 118, and 120 are formed to provide ohmic contact with regions 110, 112, and 114. Regions 110 and 112 form the emitter and collector of the pnp transistor. The epitaxial layer 20 is the base of the transistor, while region 114 and contact 120 act as the base contact.

From the above description, it will be apparent that the invention disclosed herein provides a novel and advantageous process for fabricating integrated circuits having bipolar junction transistors and other circuit elements. As will be understood by those familiar with the art, the invention may be embodied in other specific forms without departing from the spirit or essential characteristics thereof. For example, the specific process parameters described above are exemplary, and most may be changed within a certain range without adversely affecting the process, or to provide devices with different operating characteristics for different applications. Accordingly, the disclosure of the present invention is intended to be illustrative, but not limiting, of the scope of the invention, which is set forth in the following claims.

We claim:

1. A method of fabricating a bipolar transistor in a wafer having a silicon substrate of first conductivity type, an epitaxial layer of second conductivity type and a buried layer of second conductivity type disposed between a portion of the substrate and the epitaxial layer, the method comprising:
    forming a first mask over the epitaxial layer having openings therein to define a collector contact, a base, and an isolation region;
    in a desired sequence performing the steps of:
        covering at least one, but not all, of the openings for the collector contact, the base, and the isolation region with a protective layer, introducing desired conductivity type impurity into the epitaxial layer through whichever opening is not covered with the protective layer, repeating the above steps of covering and introducing until desired conductivity type impurity has been introduced into the epitaxial layer through all of the openings, the desired conductivity type being first conductivity type for the isolation and base regions and second conductivity type for the collector contact region;

forming a second mask over the epitaxial layer having an opening therein to define an emitter region situated within the base region and openings therein for ohmic connections to each of the base region, the collector contact and the isolation region;

covering at least the openings for ohmic connections to the base region and isolation region;

introducing second conductivity type impurity into the epitaxial layer through at least the emitter opening; and forming electrical connections to all of the emitter region, the base region, the collector contact region and the isolation region through the openings in the second mask.

2. A method as in claim 1, wherein the step of forming a first mask comprises:

forming a layer of silicon dioxide over the epitaxial layer; and depositing a layer of silicon nitride over the silicon dioxide.

3. A method as in claim 1 wherein the step of repeating the above steps of covering and introducing until desired conductivity type impurity has been introduced comprises:

covering the base and isolation region openings, and introducing second conductivity type impurity into the epitaxial layer through the collector contact opening;

covering the collector contact opening and the base opening but not the isolation region opening, and introducing first conductivity type impurity into the epitaxial layer through the isolation region opening; and covering the collector contact opening but not the base opening and not the isolation region opening, and introducing first conductivity type impurity into the epitaxial layer through the base opening and the isolation region opening.

4. A method as in claim 1 wherein the step of covering at least the openings for ohmic connections comprises covering only the openings for ohmic connections, and not covering the opening for the collector contact.

5. A method as in claim 1 wherein the step of forming electrical connections comprises depositing a layer of electrically conductive material over the second mask and onto the epitaxial layer through the openings in the second mask.

6. A method as in claim 1 wherein the opening in the second mask to define the ohmic connection to the base extends outside the base, and wherein the electrical connection to the base contacts both the base and the epitaxial layer to thereby form a Schottky diode.

7. A method as in claim 1 wherein the first mask further includes an opening to define a capacitor region.

8. A method as in claim 2 wherein the step of forming a first mask further comprises etching openings through the layers of silicon dioxide and silicon nitride.

9. A method as in claim 3 wherein the step of introducing first conductivity type impurity into the epitaxial layer through the isolation region opening further comprises introducing aluminum into the epitaxial layer through the isolation region opening.

10. A method as in claim 3 wherein prior to the step of covering the base and the isolation region openings a layer of silicon dioxide is formed on the epitaxial layer in all of the openings.

11. A method as in claim 4 wherein the step of introducing second conductivity type impurity into the epitaxial layer through at least the emitter opening further comprises introducing second conductivity type impurity into the epitaxial layer through both the emitter opening and the collector contact opening.

12. A method as in claim 7 wherein when impurity is introduced into the epitaxial layer through the collector contact opening, impurity is also introduced into the epitaxial layer through the capacitor opening.

13. A method as in claim 9 wherein the step of introducing first conductivity type impurity into the epitaxial layer through the base opening and the isolation region opening further comprises introducing boron into the epitaxial layer through both the isolation opening and the base region opening.

14. A method of fabricating a bipolar transistor in a wafer having a silicon substrate of first conductivity type, an epitaxial layer of second conductivity type and a buried layer of second conductivity type disposed between a portion of the substrate and the epitaxial layer, the method comprising:

forming a first mask over the epitaxial layer having openings therein to define a collector contact, a base, and an isolation region;

covering the base and isolation region openings, then introducing second conductivity type impurity into the epitaxial layer through thhe collector contact opening;

covering the collector contact opening and the base opening, but not the isolation region opening, then introducing first conductivity type impurity into the epitaxial layer through the isolation region opening;

covering the collector contact opening, but not the isolation region opening and not the base region opening, then introducing first conductivity type impurity into the epitaxial layer through both the base region opening and the isolation region opening;

forming a second mask over the epitaxial layer having an opening therein to define an emitter region within the base region and openings therein for ohmic connections to each of the base region, the collector contact and the isolation region;

covering at least the openings for ohmic connections to the base region and isolation region;

introducing second conductivity type impurity into the epitaxial layer through at least the emitter opening; and forming electrical connections to all of the emitter region, base region, collector contact region and isolation region through the openings in the second mask.

15. A method as in claim 14 wherein following the step of forming a first mask and prior to the step of covering the base and isolation region, a step is performed comprising forming a layer of insulating material over the epitaxial layer in the openings.

16. A method as in claim 14 wherein the step of introducing second conductivity type impurity into the epitaxial layer through the collector contact opening comprises implanting phosphorus.

17. A method as in claim 14 wherein the step of introducing first conductivity type impurity into the epitaxial layer through the isolation region opening comprises implanting aluminum.

18. A method as in claim 14 wherein the step of introducing second conductivity type impurity into the epitaxial layer through at least the emitter opening comprises implanting phosphorus into the epitaxial layer through both the emitter opening and the collector contact opening.

19. A method as in claim 14 wherein the step of forming a first mask further comprises defining a capacitor region, and the step of introducing second conductivity type impurity into the epitaxial layer through the collector contact opening further comprises introducing second conductivity type impurity into the epitaxial layer through the capacitor opening.

20. A method as in claim 14 wherein the epitaxial layer has a thickness of between 2.2 and 2.7 microns, a resistivity of between 0.6 and 1.0 ohm centimeters, and is doped with phosphorus.

21. A method as in claim 14 wherein the step of forming a first mask comprises:

forming a layer of silicon dioxide on the epitaxial layer; and forming a layer of silicon nitride on the layer of silicon dioxide.

22. A method as in claim 15 wherein the insulating material comprises silicon dioxide.

23. A method as in claim 17 wherein the step of introducing first conductivity type impurity into the epitaxial layer through the base opening and the isolation region opening comprises implanting boron.

24. A method as in claim 21 wherein the step of forming a second mask comprises forming at least one layer of silicon dioxide on the epitaxial layer.

* * * * *